United States Patent
Patel et al.

(10) Patent No.: US 7,010,381 B2
(45) Date of Patent: Mar. 7, 2006

(54) VERSATILE SYSTEM FOR CONTROLLING SEMICONDUCTOR TOPOGRAPHY

(75) Inventors: Nital S. Patel, Plano, TX (US); Rajesh Tiwari, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 392 days.

(21) Appl. No.: 10/654,063

(22) Filed: Sep. 3, 2003

(65) Prior Publication Data

US 2005/0064608 A1    Mar. 24, 2005

(51) Int. Cl.
*G06F 19/00*    (2006.01)

(52) U.S. Cl. .................... 700/121; 700/108; 438/633

(58) Field of Classification Search ............... 700/121, 700/108, 182; 438/5, 633, 626, 693; 451/41; 716/21, 10, 20; 703/2
See application file for complete search history.

(56) References Cited

U.S. PATENT DOCUMENTS 5,893,756 A * 4/1999 Berman et al. ............. 438/692
6,004,188 A * 12/1999 Roy ............................ 451/41
6,251,789 B1 * 6/2001 Wilson et al. .............. 438/693
6,274,478 B1 * 8/2001 Farkas et al. ............... 438/626

* cited by examiner

*Primary Examiner*—Kidest Bahta
(74) *Attorney, Agent, or Firm*—Peter K. McLarty; W. James Brady, III; Frederick J. Telecky, Jr.

(57) ABSTRACT

The present invention defines a system (200) for selectively controlling post-CMP dishing effects occurring in semiconductor wafers having copper metallization. The system has a CMP system (202) that performs copper overpolish and barrier polish on a copper-based semiconductor wafer (206). A profilometer (204) measures actual dishing occurring in the copper metallization after polishing. An input data set (220) includes a dishing target for the semiconductor wafer. A data integrity function (212) evaluates the profilometer's measurement, and generates an indicator of the reliability of the measurement. A modeling function (214) receives the measurement, the indicator, and the dishing target, and evaluates any differential between the dishing target and actual dishing. The modeling function generates a processing target to eliminate the differential, and modifies this process responsive to the indicator. A processing control function (210) receives the processing target, and alters the copper overpolish or barrier polish responsive to the processing target.

24 Claims, 3 Drawing Sheets

VERSATILE SYSTEM FOR CONTROLLING SEMICONDUCTOR TOPOGRAPHY

TECHNICAL FIELD OF THE INVENTION

The present invention relates generally to the field of semiconductor manufacturing processes and, more particularly, to apparatus and methods for controlling processing to effect a desired post-processing topography.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Every device must be smaller without damaging the operating characteristics of the integrated circuit devices. High packing density, low heat generation, and low power consumption, with good reliability and long operation life must be maintained without any functional device degradation. Increased packing density of integrated circuits is usually accompanied by smaller feature size.

As integrated circuits become denser, the widths of interconnect layers that connect transistors and other semiconductor devices of the integrated circuit are reduced. As the widths of interconnect layers and semiconductor devices decrease, their resistance increases. As a result, semiconductor manufacturers seek to create smaller and faster devices by using, for example, a copper interconnect instead of a traditional aluminum interconnect. Unfortunately, copper is very difficult to etch in most semiconductor process flows. Therefore, damascene processes have been proposed and implemented to form copper interconnects.

Damascene methods usually involve forming a trench and/or an opening in a dielectric layer that lies beneath and on either side of the copper-containing structures. Once the trenches or openings are formed, a blanket layer of the copper-containing material is formed over the entire device. Electrochemical deposition (ECD) is typically the only practical method to form a blanket layer of copper. The thickness of such a layer must be at least as thick as the deepest trench or opening. After the trenches or openings are filled with the copper-containing material, the copper-containing material over them is removed, e.g., by chemical-mechanical planarization (CMP), so as to leave the copper containing material in the trenches and openings but not over the dielectric or over the uppermost portion of the trench or opening.

During CMP, copper and the adjacent dielectric are removed from the wafer at different rates. Typically, a copper-selective chemical slurry is applied, after which a first round of polishing occurs. Then, a dielectric-selective slurry is applied, followed by more polishing. This process creates certain surface anomalies, and a varying post-CMP topography. A number of factors, including pattern geometry (e.g., copper line density), affect the removal rates and add to the surface anomalies. One common surface anomaly that occurs with copper CMP is dishing. Dishing occurs when the copper recedes below or protrudes above the level of the adjacent dielectric. Theoretically, the goal of the CMP process is to achieve a flat post-CMP topography, as excessive dishing can negatively impact process yields. In practice, however, some processes may achieve optimal yields with a slight, or even moderate, amount of dishing. Regardless of whether a flat or slightly dished topology is desired, the ability to monitor and actively control the amount of dishing is critical to achieving optimal process yields.

A number of conventional methods exist by which post-CMP topography can be measured or profiled. Typically, such characterization is referred to as metrology. Unfortunately, a number of such conventional methods are destructive in nature, or are limited in scope to very small test areas on a wafer. As such, these approaches are not of much use for high-volume, in-process applications. More common in these applications is the use of profilometry—a typically non-destructive process that involves physical movement of a stylus along the surface of a wafer. Unfortunately, however, current profilometry approaches provide only the ability to render a relative physical measurement or characterization of post-CMP topography. They do not provide the ability to actively control the CMP process based on metrology data.

There are some existing methods that attempt to modify post-CMP topologies in response to profilometry data. Unfortunately, there are certain drawbacks associated with each. Most conventional methods either require additional processing steps or changes to device layout and design—adding costs to and reducing the efficiency of production processes. These approaches augment, instead of optimize, the already existing process steps. Additionally, many such conventional methods tend to be rather static in nature. Dynamic modification of CMP on a wafer-to-wafer, or even lot-to-lot, basis in order to address subtle variations in metrology data is simply not possible or not operationally feasible. The substantial effort and cost associated with modifying the CMP process often translates into substantial yield losses to dishing before a change can be justified. Furthermore, many such approaches are not designed for concurrent, cooperative use with comprehensive profilometry systems and methods.

As a result, there is a need for a versatile system for controlling the post-CMP topology of semiconductor wafer—a system that provides direct and dynamic control of CMP processing, and concurrent, cooperative use with comprehensive profilometry evaluation, in an easy, efficient and cost-effective manner.

SUMMARY OF THE INVENTION

The present invention provides a versatile system for controlling the post-processing topology of a semiconductor wafer in an easy, efficient and cost-effective manner. The present invention is particularly applicable to controlling the post-CMP topology of a semiconductor wafer. The present invention provides direct control of CMP processing, responsive—in a dynamic or quasi-dynamic fashion—to a comprehensive profilometry evaluation.

The present invention provides a system that is readily integratable with high-volume semiconductor manufacturing processes. The system of the present invention does not require additional device processing steps but, rather, provides modeling and control subsystems that direct CMP processes in a desired manner. The modeling and control subsystems of the present invention cooperate with a profilometry evaluation system—one that provides accurate and timely data regarding current post-CMP topology—to determine the CMP modifications necessary to effect a desired post-CMP topology. The present invention thus optimizes CMP processing to provide desired post-CMP topologies in an efficient and effective manner, overcoming certain limitations commonly associated with most conventional systems.

More specifically, the present invention provides a system for controlling post-CMP topology of semiconductor wafers, comprising a CMP processing function that performs CMP on a semiconductor wafer. A profilometry function renders a characterization of the actual surface topology of the semiconductor wafer after CMP. An input data set indicates a number of process variables and data points, including desired post-CMP topology for the semiconductor wafer. A control system receives the input data set and the characterization. The control system identifies any differential between the actual surface topology and the desired post-CMP topology, and eliminate that differential by altering the processing performed by the CMP processing function.

The present invention also provides a method for controlling post-processing topology of semiconductor wafers that utilize copper metallization. The method includes providing a semiconductor wafer having copper metallization. A processing function performs a process on the semiconductor wafer. A profilometry function renders a characterization of actual surface topology of the semiconductor wafer after the process is performed. An input data set is provided, comprising a desired post-processing topology for the semiconductor wafer. A control system receives the input data set and the characterization. The control system identifies a differential, if any, between the actual surface topology and the desired post-processing topology. The control system then alters the process performed by the processing function to eliminate the differential.

The present invention further provides a system for selectively controlling post-CMP dishing effects occurring in semiconductor wafers that utilize copper metallization. The system includes a CMP processing system performing polishing, including copper overpolish and barrier polish, on a semiconductor wafer having copper metallization. A profilometer is adapted to render a measurement of actual dishing occurring in the copper metallization of the semiconductor wafer after polishing. The system receives an input data set, comprising a dishing target for the semiconductor wafer. A data integrity function evaluates the profilometer's measurement, and generates some indicator of the reliability of this measurement. A control modeling function receives the measurement, the indicator of reliability, and the input data set. The control modeling function determines what, if any, differential exists between the dishing target and actual dishing. Based on the differential, the control modeling function generates a processing target for eliminating the differential. The control modeling function is further configured to modify its generation of processing targets responsive to the indicator of reliability. The system further comprises a processing control function that receives the processing target, and translates that target into alterations of the copper overpolish, barrier polish, or both copper overpolish and barrier polish processes.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts, which can be embodied in a wide variety of specific contexts. The invention will now be described in conjunction with providing a system for controlling CMP processing during the manufacture of semiconductor devices utilizing copper interconnects and vias. The specific embodiments discussed herein are, however, merely illustrative of specific ways to make and use the invention and do not limit the scope of the invention.

The present invention provides a versatile system for controlling the post-processing topology of a semiconductor wafer—particularly the post-CMP topology of a semiconductor wafer. The present invention provides direct control of a CMP process, responsive to a comprehensive profilometry evaluation system. Depending upon the sophistication of the manufacturing and metrology tools available, the present invention may be applied to provide such direct control in a quasi-dynamic or fully dynamic manner.

The present invention provides a system that is easily integrated into high-volume semiconductor manufacturing processes. The system of the present invention does not require additional device processing steps. Instead, the present invention provides modeling and control subsystems that direct CMP processes in a desired manner.

The modeling and control subsystems of the present invention cooperate with a comprehensive profilometry evaluation system. Although there are a number of possible embodiments, the profilometry system of the present invention must provide accurate and timely data regarding wafer topologies, especially recent post-CMP topologies. The present invention utilizes this data to determine the CMP modifications necessary to effect a desired post-CMP topology. The present invention thus optimizes CMP processing to provide desired post-CMP topologies in an efficient and effective manner, overcoming certain limitations commonly associated with most conventional systems.

Figure 1:
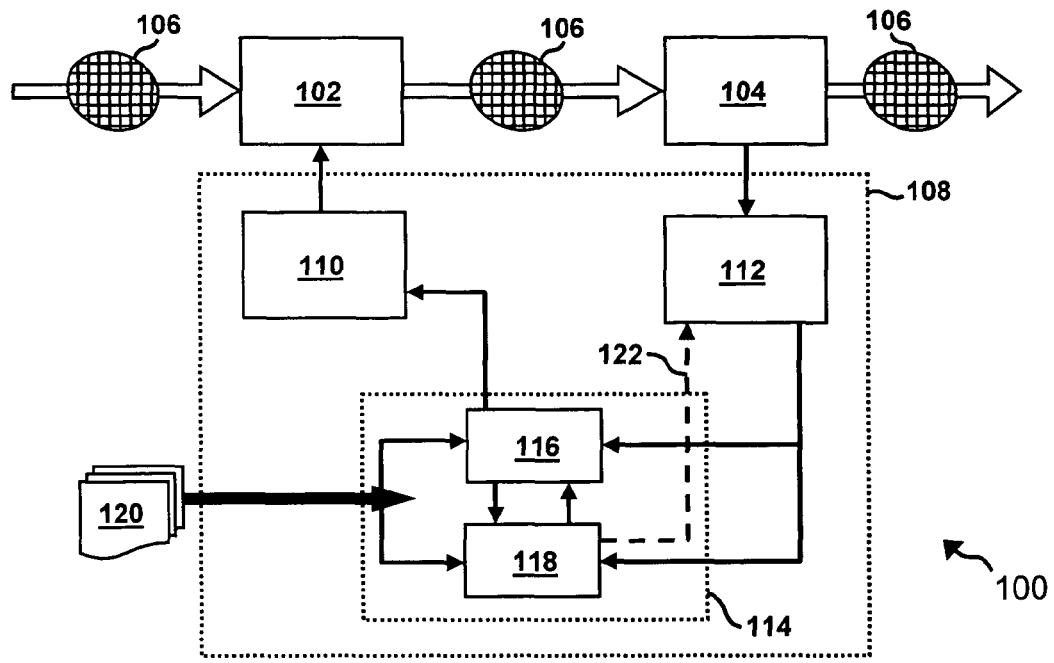
FIG. 1 is an illustration of one embodiment of a semiconductor processing system according to the present invention.

The present invention is described in greater detail now with reference to FIG. 1, which depicts one embodiment of a semiconductor processing system 100 according to the present invention. System 100 comprises a processing function 102 and a profilometry function 104. A semiconductor substrate or wafer 106 is queued up for processing by function 102. After some level of processing by function 102, wafer 106 undergoes a topological evaluation by profilometry function 104. After that, wafer 106 continues on for further processing.

Depending upon the nature and sophistication of the processing and profilometry tools and devices utilized by functions 102 and 104, a number of potential configurations and operations may be provided. In one embodiment, for example, function 102 may comprise a stand-alone CMP system and function 104 may comprise a stand-alone profilometry tool (e.g., a stylus profilometer). After CMP is complete, wafer 106 is physically transferred from the CMP apparatus to the profilometry apparatus. In an alternative embodiment, profilometry function 104 may be provided as an integrated subsystem or component of processing function 102. For example, function 104 may comprise a profilometer that has been integrated as a component within a CMP apparatus 102. In this embodiment, function 104 may be configured to provide profilometry data about wafer 106 at various stages during CMP (e.g., after overpolish, before barrier polish). Other variations, and combinations thereof, are comprehended by the present invention.

System 100 further comprises control system 108, communicatively interfaced with functions 102 and 104. System 108 comprises a processing control function 110 and a data integrity function 112. Functions 110 and 112 are communicatively interfaced with functions 102 and 104, respectively. Depending upon the specific configuration of functions 102 and 104, the communicative interfaces with functions 110 and 112 may comprise separate direct interfaces or a single shared interface, as appropriate. System 108 further comprises a control modeling function 114 communicatively interfaced with functions 110 and 112.

Function 114 comprises two functional modules. The first is topology modeling function 116. The second is modeling update function 118. Function 114 receives an input data set 120 that comprises a number of input variables utilized by function 116 and 118. Input data set 120 may be provided manually (e.g., input by an operator) or automatically (e.g., loaded from a storage device or host processor). Function 112 communicates with function 114 to provide data, as described hereafter, for use by functions 116 and 118. Depending upon desired system performance, and the particular configuration of system 100, function 114 may be configured to provide certain data, as described hereafter, to function 112 from function 118. Function 114 communicates with function 110 to provide data, as described hereafter, relating to necessary modifications in the operation of function 102.

System 108 and each of its constituent functions and modules may be implemented in a variety of ways. Each such entity may comprise various hardware or software constructs, or combinations of both, implemented as stand-alone or integrated functions. Although the constituent functions and modules of system 108 are functionally interrelated, they may be implemented in physically collocated or separate structures. For example, in one embodiment, system 108 may comprise a stand-alone computer communicatively interfaced with processing function 102 and profilometry function 104. Functions 110–118 may be implemented as software constructs stored and executed by the computer. In an alternative embodiment, function 110 may comprise a software construct residing within some processor on board function 102, while function 112 comprises a software construct residing within some processor on board function 104. Function 114 is implemented in a physically separate computer communicatively interfaced with functions 102 and 104. In yet another alternative embodiment, functions 102, 104, 110, 112 and 114 may all be implemented within a single piece of processing equipment. Functions requiring physical manipulation or action are implemented in hardware, while the remaining functions are implemented as software constructs operable on a host processing capability. Other similar variations and combinations are comprehended by the present invention.

Operationally, system 100 functions as follows. A semiconductor wafer or substrate 106 is queued for processing. For purposes of the present invention, wafer 106 may be queued individually or in lots, depending upon the relative complexity and desired performance of system 100. Typically, semiconductor processes in current use queue semiconductor wafers in lots. Thus, for purposes of explanation and illustration, wafer 106 in FIG. 1 is considered to be queued as part of a semiconductor wafer lot. Certain input variables (e.g., die density, processing equipment characteristics, desired topology characteristics) corresponding to the lot containing wafer 106 are input to system 108 as data set 120.

System 108 communicates some desired processing level, described in greater detail hereinafter, to processing function 102. Processing function 102 performs the desired processing on wafer 106. Profilometry function 104 assesses the resulting topology on wafer 106, and generates some measurement or other profile characteristic indicating the outcome of processing by function 102. This measurement or other profile characteristic is evaluated for accuracy by function 112. Generally, function 112 compares the measured value to some expected value (e.g., a target topology correlating the desired processing level), determines a differential between the two values, and generates some indicia (e.g., goodness-of-fit metric, % confidence metric, etc.) of the reliability or accuracy of the measurement. Function 112 may internally determine or generate the expected value from, for example, extrapolated historical data, a modeling scheme, or combinations thereof; or the expected value may be communicated or transferred from another device or function within system 100 (e.g., function 114).

As depicted in FIG. 1, certain embodiments of system 100 may comprise a communicative link 122 by which function 118 can provide or update function 112 with historical or modeling data. Function 112 provides, via communicative link 124, the profilometry measurement from function 104, together with the accuracy indicia, to function 114. Other variations and combinations may be utilized in accordance with the present invention, as long as function 112 delivers the profilometry measurement data, together with some reliability or accuracy indicia, to function 114.

Function 114 receives a number of data inputs, from data set 120 and from function 112. Among those received, one particular input characterizes the topology target or goal. In certain embodiments, for example, this may comprise a narrow target range for dishing. Other data inputs may comprise information relating to various aspects of the semiconductor wafers being processed and the processing materials and components being used (e.g., slurry composition, pad life/wear data). Modeling function 116 comprises a data model characterizing nominal dishing values for varying die densities. Function 116 accesses this model from function 118, which may correct or modify the model over time as described hereinafter. This data model provides a baseline reference for processing conditions (e.g., overpolish and barrier polish times).

When a lot containing wafer 106 is queued for processing, system 108 analyzes the input data set 120 that accompanies that lot. System 108 utilizes one or more algorithms, or similar methodologies, to cross-reference and compile the various data inputs received, compare those inputs to the baseline model in function 116, determine any differentials between the input values and the baseline model, and develop those differentials into a processing target.

In certain embodiments, for example, the model of function 116 may indicate that, in order to achieve the desired topology target, function 102 should perform a certain amount (X) of processing to remove a desired amount of material. After processing data input regarding die density of wafer 106, however, function 110 may determine that some additional amount of processing (Y) should occur. Function 110 may next evaluate data regarding the correlation between process time and physical characteristics of certain processing equipment being used (e.g., historical wear data on polishing pads), and determine that processing should be reduced by some amount (Z). In this simplified example, system 108 thus develops a processing target of (X+Y−Z).

Function 114 may evaluate the reliability indicator received from function 112. If function 114 determines that the indictor falls within an acceptable range, then system 108 adjusts the processing parameters of function 102 in accordance with the processing target. If the indicator is not within an acceptable range, then function 118 processes or updates one or more of the models or data references that it utilizes to update the model of function 116. Function 114 may be configured to store some or all of the data inputs and references that it utilizes for its evaluations or, alternatively, it may access and retrieve those data sources from some external source.

Even when the reliability indicator falls within an acceptable range, function 118 may be utilized to alter the model of function 116 to effect a desired change in system 100. Function 118 may be configured to passively store and record historical performance data from within system 100. In particular, function 118 may be configured to receive and store the profilometry measurement received from function 112. Function 118 may also be configured to generate correlation references, relating the historical metrology measurements to a variety of other process variables. It may also be configured to receive and store historical data, or model data, references from an external source (e.g., a host processor environment, an operator entry). Function 110 may be similarly configured to store and generate references.

Based upon the processing target, function 110 determines the process settings necessary to achieve the desired topology target within function 102. Function 110 communicates these necessary process settings (e.g., maximum time for each process step) to function 102. The process of function 102 is modified accordingly, prior to processing of the next wafer (or lot) 106. This entire cycle restarts, and continues iterating on a constant or periodic basis, as desired.

Figure 2:
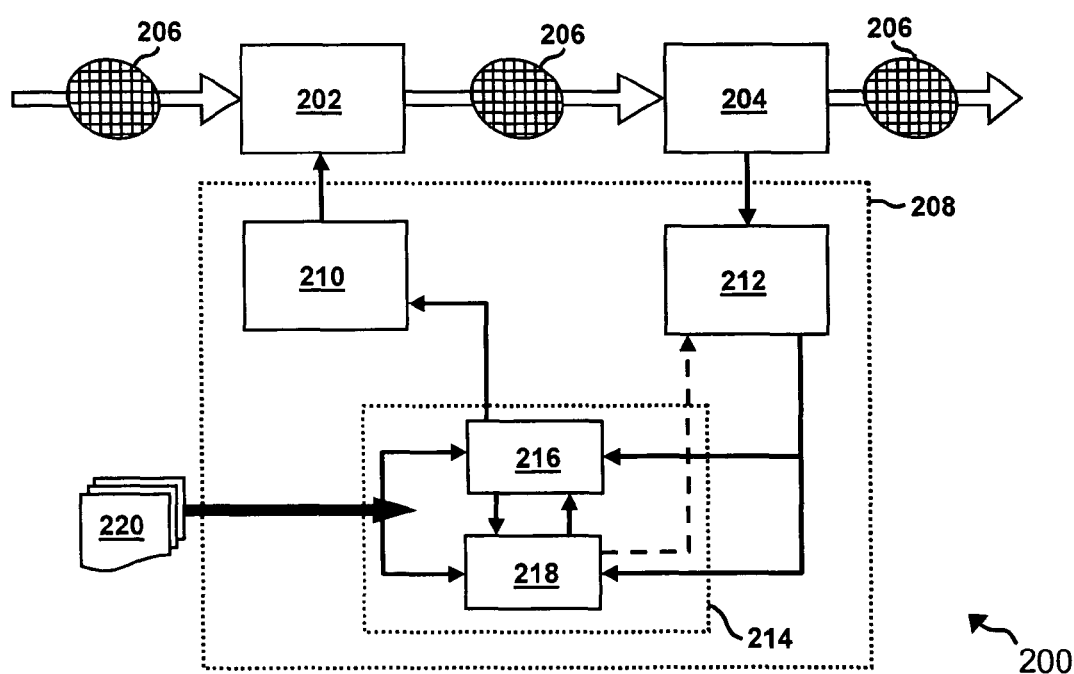
FIG. 2 is an illustration of another embodiment of a semiconductor processing system according to the present invention.

The present invention is described in greater detail now with reference to one specific processing system application, as depicted by system 200 of FIG. 2. System 200 comprises a CMP system 202 and a profilometer system 204. A semiconductor wafer lot 206 is queued up for processing by system 202.

System 200 further comprises control system 208, implemented within a separate computer system, communicatively interfaced with systems 202 and 204. System 208 comprises a processing control function 210 and a data integrity function 212. Functions 210 and 212 are communicatively interfaced with systems 202 and 204, respectively. System 208 further comprises a control modeling function 214 communicatively interfaced with functions 210 and 212.

Function 214 comprises two functional modules. The first is topology modeling function 216. The second is modeling update function 218. Function 214 receives an input data set 220 that comprises a number of input variables utilized by function 216 and 218. Input data set 220 may be provided manually (e.g., input by an operator) or automatically (e.g., loaded from a storage device or host processor). Function 212 communicates with function 214 to provide data for use by functions 216 and 218. In alternative embodiments of system 200, function 212 may reside within function 216 or 218.

Figure 3A:
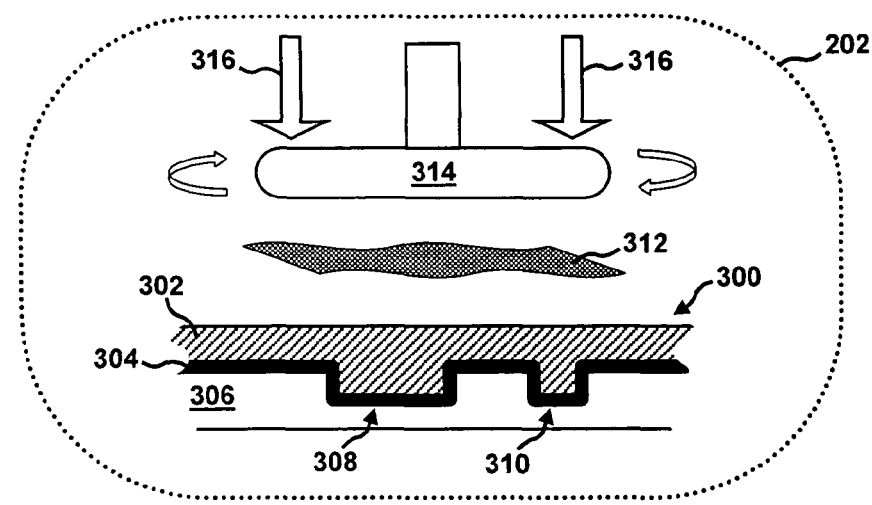
FIGS. 3a–3d depict progressive stages of processing performed on a semiconductor wafer by one member of the system depicted in FIG. 2.

The operation of system 202 is described in greater detail with reference now to FIGS. 3a–3d. In FIG. 3a, a portion 300 of a wafer from lot 206 is depicted. Portion 300 comprises a semiconductor device structure loaded into system 202 after copper ECD. Portion 300 comprise three regions: a copper region 302, a barrier region 304, and a dielectric region 306. Region 306 comprises two trench features, feature 308 and feature 310, which will—after CMP—become copper interconnects within a semiconductor device. System 202 is used to polish unwanted material from portion 300, until a final desired topology is achieved. A copper-selective slurry 312, or some other suitable compound, is applied to the upper surface of region 302. A polishing apparatus having a polishing pad 314 applies downward force 316 while polishing (generally in a rotational manner) slurry 312 into region 302. Region 302 is thus abraded until the copper begins to clear from portion 300, specifically until some portion of region 304 is exposed.

Figure 3B:
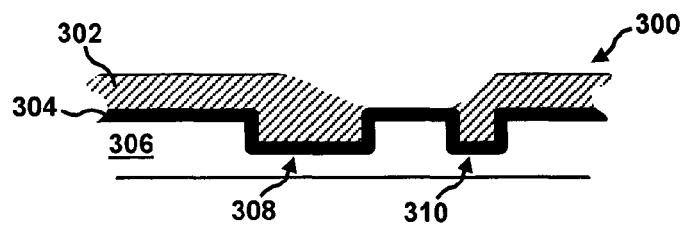

The current appearance of portion 300 is now depicted in FIG. 3b. Although some portion of region 302 has been cleared, the copper-selective polishing continues until planar portions 318 of region 304 have been exposed, as depicted now in FIG. 3c. This is referred to as overpolish. Overpolish is necessary to completely remove the copper from all areas, except trenches 308 and 310. If all other copper is not removed, device reliability and performance problems may result. As depicted, some degree of dishing 320 may appear in larger copper features such as trench 308. This due to a combination of factors, including the to copper-selectivity of slurry 312, the polishing time, the degree of flexion in pad 314, and the force 316 applied during polishing. Generally, longer polishing times, slurries of higher copper selectivity, polishing pads having greater flexion, and greater polishing forces may all increase dishing.

Figure 3C:
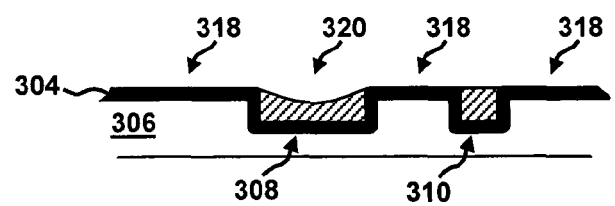
Figure 3D:
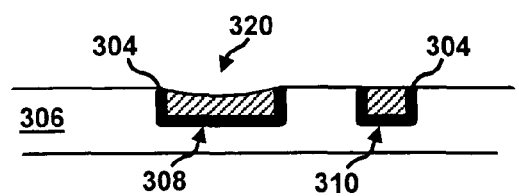

Referring now to FIG. 3c, once the planar portions 318 of region 304 have been exposed, a barrier-selective slurry or some other suitable compound (not shown) is applied to the upper surface of region 304 and polishing begins again. This process is referred to as barrier polish. Barrier polishing continues just until the lateral portions of region 304 (i.e., the portions outside trenches 308 and 310) have been cleared away, as depicted now in FIG. 3d. Excessive barrier polish can strip away dielectric 306, or excessive portions of trenches 308 and 310, negatively impacting the performance or reliability of the semiconductor device. As seen in FIG. 3d, some degree of dishing 320 remains, although the barrier polish process actually reduces that degree of dishing present after overpolish (as depicted in FIG. 3c).

Figure 4:
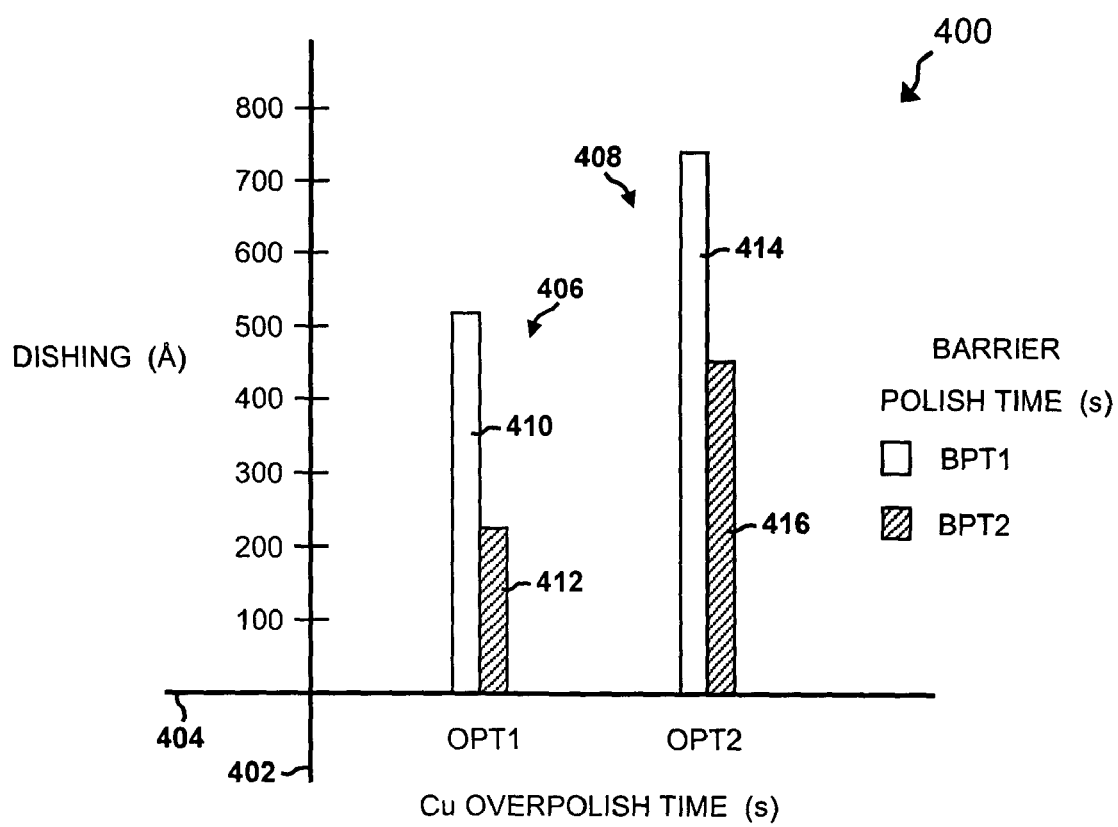
FIG. 4 provides an illustrative example of one embodiment of data analysis that may be utilized in accordance with the present invention.

Data concerning this phenomenon can be logged and utilized by system 208 in modeling and controlling the operation of system 202. This is illustrated now in reference to FIG. 4. FIG. 4 depicts a graph 400 illustrating dishing data that may be logged and analyzed by system 208 during the operation of system 200. Graph 400 plots dishing, as measured in Angstroms (Å), along axis 402 against copper overpolish time, measured in seconds (s), along axis 404. Two data sets 406 and 408 are plotted. Set 406 plots dishing data for a copper overpolish time OPT1. Set 406 comprises two data points 410 and 412, corresponding to dishing results occurring after barrier polish times BPT1 and BPT2, respectively. BPT1 is less than BPT2 by some interval of time. Similarly, set 408 plots dishing data for a copper overpolish time OPT2. OPT2 is greater than OPT1 by some interval of time. Set 408 comprises two data points 414 and 416, corresponding to dishing results occurring after barrier polish times BPT1 and BPT2, respectively.

Graph 400 is merely illustrative of the data that may be logged, recorded or analyzed by system 208 during operation. In most applications, system 208 would implement algorithms or other analytical processes to analyze such data in purely numerical form. Nonetheless, system 208 identifies from the data that increasing overpolish time increases dishing, while increasing barrier polish time decreases dishing. This trend is extrapolated to model desired topology based on processing times within system 202. Thus, system 208 can direct system 202 to selectively increase or decrease overpolish or barrier polish times to achieve a desired dishing result.

For example, assume that, for process 200, dishing of 400 Å results in optimal product yield. Data set 220 communicates to system 208 that dishing of 400 Å is desired. This becomes the topology target. System 208 may determine, for example, that the model of function 216 is currently configured for dishing of 600 Å. Function 214 identifies a differential of 200 Å. Function 214 forwards this result to function 210 as the processing target. Function 210 translates the processing target into specific overpolish and barrier polish times, and adjusts the operation of system 202 accordingly. In this manner, system 208 utilizes process-specific data to evaluate and control system 202 to deliver a desired post-CMP topology.

In similar fashion, system 208 may be configured to compile or utilize a variety of historical or comparative data relating certain process characteristics to dishing results (i.e., product yields). For example, data may be compiled correlating average die densities to dishing results. For a given lot 206, the average die density may be input in data set 220. System 208 evaluates, for the given die density, what degree of dishing may be expected based on historical data. Assume, for example, that dishing of 800 Å is to be expected for the given die density. Input data set 220 indicates, however, that a target topology having dishing of 600 Å is desired. System 208 alters the dishing model of function 216 to reduce dishing to 600 Å by decreasing overpolish, increasing barrier polish, or doing both in combination, and the operation of system 202 is altered accordingly. Other data relating certain process characteristics to dishing results (e.g., correlating polishing pad wear to dishing) may similarly be compiled and utilized by system 208.

Thus, according to the present invention, a semiconductor processing system (e.g., a CMP processing system) may be augmented to provide selective, dynamic control of resulting wafer topologies. The present invention utilizes specific historical data and models to effect very specific modifications in processing-providing precise control of semiconductor topography.

The embodiments and examples set forth herein are presented to best explain the present invention and its practical application and to thereby enable those skilled in the art to make and utilize the invention. However, those skilled in the art will recognize that the foregoing description and examples have been presented for the purpose of illustration and example only. The description as set forth is not intended to be exhaustive or to limit the invention to the precise form disclosed. Many modifications and variations are possible in light of the above teaching without departing from the spirit and scope of the following claims.

What is claimed is:

1. A system for controlling post-processing topology of semiconductor wafers, the system comprising:
  a processing function adapted to perform a process on a semiconductor wafer;
  a profilometry function adapted to render a characterization of actual surface topology of the semiconductor wafer after the process is performed;
  an input data set indicating a desired post-processing topology for the semiconductor wafer; and
  a control system adapted to receive the input data set and the characterization, to identify a differential between the actual surface topology and the desired post-processing topology, and to eliminate the differential by altering the process performed by the processing function.

2. The system of claim 1, wherein the semiconductor wafer comprises copper.

3. The system of claim 1, wherein the process comprises CMP.

4. The system of claim 3, wherein the processing function performs a barrier polish on the semiconductor wafer.

5. The system of claim 3, wherein the processing function performs an overpolish on the semiconductor wafer.

6. The system of claim 1, wherein the profilometry function comprises a profilometer.

7. The system of claim 6, wherein the profilometer comprises a stylus-type profilometer.

8. The system of claim 1, wherein the profilometry function is adapted to render a measurement of dishing.

9. The system of claim 8, wherein the input data set indicates a desired amount of dishing.

10. The system of claim 1, wherein the control system further comprises:
  a data integrity function, adapted to evaluate reliability of the characterization and provide some indicia of the reliability,
  a control function adapted to alter performance of the process within the processing function; and
  a control modeling function, adapted to receive and evaluate the characterization, the indicia, and the desired post-processing topology, and adapted to provide to the control function a processing target for alteration of the process within the processing function.

11. The system of claim 10, wherein at least one of the data integrity, control, or control modeling functions is implemented utilizing software.

12. The system of claim 11, wherein at least one of the data integrity, control, or control modeling functions is implemented utilizing hardware.

13. A method for controlling post-processing topology of semiconductor wafers that utilize copper metallization, the method comprising the steps of:
  providing a semiconductor wafer having copper metallization;
  providing a processing function to perform a process on the semiconductor wafer;

providing a profilometry function to render a characterization of actual surface topology of the semiconductor wafer after the process is performed;
providing an input data set comprising a desired post-processing topology for the semiconductor wafer;
providing a control system to receive the input data set and the characterization;
utilizing the control system to identify a differential between the actual surface topology and the desired post-processing topology; and
utilizing the control system to alter the process performed by the processing function to eliminate the differential.

14. The method of claim 13, wherein the step of providing a processing function further comprises providing a CMP processing function.

15. The method of claim 14, wherein the step of providing a processing function further comprises providing a CMP processing function that performs a barrier polish on the semiconductor wafer.

16. The method of claim 14, wherein the step of providing a processing function further comprises providing a CMP processing function that performs an overpolish on the semiconductor wafer.

17. The method of claim 13, wherein the step of providing a profilometry function further comprises providing a profilometer.

18. The method of claim 17, wherein the step of providing a profilometry function further comprises providing a stylus-type profilometer.

19. The method of claim 13, wherein the profilometry function renders a measurement of dishing.

20. The method of claim 19, wherein the step of providing an input data set further comprises providing a desired amount of dishing.

21. The method of claim 13, wherein the step of providing a control system further comprises providing a data integrity function, to evaluate reliability of the characterization and provide some indicia of the reliability.

22. The method of claim 13, wherein the step of providing a control system further comprises providing a control function to alter performance of the process within the processing function.

23. The method of claim 13, wherein the step of providing a control system further comprises providing a control modeling function to receive and evaluate the characterization, the indicia, and the desired post-processing topology, and to generate a processing target for alteration of the process within the processing function.

24. A system for selectively controlling post-CMP dishing effects occurring in semiconductor wafers utilizing copper metallization, the system comprising:
a CMP processing system adapted to perform polishing, comprising copper overpolish and barrier polish, on a semiconductor wafer utilizing copper metallization;
a profilometer adapted to render a measurement of actual dishing occurring in the copper metallization of the semiconductor wafer after polishing;
an input data set comprising a dishing target for the semiconductor wafer;
a data integrity function adapted to evaluate the measurement and to generate indicia of the reliability of the measurement;
a control modeling function adapted to receive the measurement, the indicia of reliability and the input data set, to determine a differential between the dishing target and actual dishing, to generate a processing target for eliminating the differential, and to modify its processing target generation responsive to the indicia of reliability; and
a processing control function adapted to receive the processing target and to alter the copper overpolish, barrier polish, or both copper overpolish and barrier polish, responsive to the processing target.

* * * * *